United States Patent
Kuschewski et al.

(10) Patent No.: US 9,792,543 B2
(45) Date of Patent: Oct. 17, 2017

(54) TRANSPONDER LAYER AND METHOD FOR THE PRODUCTION THEREOF

(71) Applicant: Smartrac IP B.V., Amsterdam (NL)

(72) Inventors: Martin Kuschewski, Marktoberdorf (DE); Manfred Rietzler, Marktoberdorf (DE)

(73) Assignee: SMARTRAC I.P. B.V., Amsterdam (NL)

(*) Notice: Subject to any disclaimer, the term of this patent is extended or adjusted under 35 U.S.C. 154(b) by 0 days.

(21) Appl. No.: 14/391,273

(22) PCT Filed: Apr. 4, 2013

(86) PCT No.: PCT/EP2013/001000
§ 371 (c)(1),
(2) Date: Oct. 8, 2014

(87) PCT Pub. No.: WO2013/152840
PCT Pub. Date: Oct. 17, 2013

(65) Prior Publication Data
US 2015/0115038 A1    Apr. 30, 2015

(30) Foreign Application Priority Data
Apr. 10, 2012    (DE) .................. 10 2012 205 768

(51) Int. Cl.
G06K 19/07    (2006.01)
G06K 19/077    (2006.01)
H01L 23/00    (2006.01)

(52) U.S. Cl.
CPC ... *G06K 19/07754* (2013.01); *G06K 19/0775* (2013.01); *G06K 19/07722* (2013.01);
(Continued)

(58) Field of Classification Search
CPC ......... G06K 19/07749; G06K 19/0775; G06K 19/07779; G06K 19/07783; G06K 19/07745; G06K 19/077
See application file for complete search history.

(56) References Cited

U.S. PATENT DOCUMENTS 5,969,951 A * 10/1999 Fischer ............ G06K 19/07745
235/492
6,095,423 A * 8/2000 Houdeau .......... G06K 19/07743
235/487
(Continued)

FOREIGN PATENT DOCUMENTS

CN    1200185 A    11/1998
DE    195 00 925 A1    7/1996
(Continued)

OTHER PUBLICATIONS

PCT Translation of the International Preliminary Report on Patentability, PCT/EP2013/001000, dated Oct. 23, 2014, 11 pages.
(Continued)

*Primary Examiner* — Christopher Stanford
(74) *Attorney, Agent, or Firm* — Quarles & Brady LLP

(57) ABSTRACT

The invention relates to a transponder layer (10), in particular for producing a chip card, having an antenna substrate (12), which, on an antenna side (11), is equipped with an antenna (14) formed from a wire conductor (13), and has a chip accommodation which is formed by a recess in the antenna substrate and in which a chip (21) is accommodated, wherein wire conductor ends, which serve to form terminal ends (15) of the antenna, are formed at a bottom (20) of the chip accommodation which is recessed with respect to the rear side (26) of the antenna substrate (12), and the chip is accommodated in the chip accommodation in such a manner that terminal contacts (22) arranged on a contact side (36) of the chip are contacted with flat contact portions (19) of the
(Continued)

terminal ends (15), and the chip is arranged with the rear side (27) of its semiconductor body (28) facing the terminal contacts substantially flush with the rear side of the antenna substrate. Furthermore, the invention relates to a method for producing a transponder layer.

5 Claims, 3 Drawing Sheets

(52) U.S. Cl.
CPC .... *H01L 24/81* (2013.01); *H01L 2224/16225* (2013.01); *H01L 2224/16227* (2013.01); *H01L 2224/8185* (2013.01); *H01L 2224/81191* (2013.01); *H01L 2224/81201* (2013.01); *H01L 2224/81224* (2013.01); *H01L 2924/12042* (2013.01); *H01L 2924/141* (2013.01)

(56) References Cited

U.S. PATENT DOCUMENTS

| | | | | |
|---|---|---|---|---|
| 6,095,424 | A * | 8/2000 | Prancz | 235/492 |
| 6,142,381 | A * | 11/2000 | Finn et al. | 235/492 |
| 6,161,761 | A * | 12/2000 | Ghaem et al. | 235/492 |
| 6,164,551 | A * | 12/2000 | Altwasser | G01V 15/00 235/383 |
| 6,374,486 | B1 * | 4/2002 | Brechignac | 29/840 |
| 6,557,767 | B1 * | 5/2003 | Hayashi | 235/492 |
| 8,957,349 | B2 * | 2/2015 | Matsumoto | B41J 2/442 219/121.6 |
| 2003/0057536 | A1 | 3/2003 | Akagawa | |
| 2003/0136503 | A1 * | 7/2003 | Green | B32B 38/0004 156/264 |
| 2004/0129786 | A1 * | 7/2004 | Reignoux | G06K 19/07749 235/492 |
| 2004/0188531 | A1 * | 9/2004 | Gengel | G06K 19/027 235/491 |
| 2005/0011960 | A1 * | 1/2005 | Koike | G06K 19/07749 235/492 |
| 2006/0097911 | A1 * | 5/2006 | Bussiere et al. | 342/175 |
| 2006/0118229 | A1 * | 6/2006 | Ohashi | G06K 19/077 156/60 |
| 2006/0185790 | A1 * | 8/2006 | Eckstein | B32B 37/025 156/267 |
| 2006/0244662 | A1 * | 11/2006 | Bauer | H01Q 1/22 343/700 MS |
| 2007/0007344 | A1 * | 1/2007 | Inoue | G06K 19/07749 235/435 |
| 2007/0040686 | A1 * | 2/2007 | Reis | G06K 19/07718 340/572.7 |
| 2007/0096917 | A1 * | 5/2007 | Yang | H01Q 1/2225 340/572.8 |
| 2012/0040128 | A1 * | 2/2012 | Finn | G06K 19/07783 428/96 |

FOREIGN PATENT DOCUMENTS

| | | |
|---|---|---|
| DE | 199 42 932 C2 | 1/2002 |
| DE | 103 24 043 A1 | 12/2004 |
| EP | 1 054 346 A2 | 11/2000 |

OTHER PUBLICATIONS

International Search Report dated Jun. 26, 2013 for International Application No. PCT/EP2013/001000.
State Intellectual Property Office of the People's Republic of China, First Office Action, Application No. 201380018642, dated Jun. 21, 2016.
State Intellectual Property Office of the People's Republic of China, Second Office Action, Application No. 201380018642.8, dated Apr. 21, 2017.

* cited by examiner

TRANSPONDER LAYER AND METHOD FOR THE PRODUCTION THEREOF

CROSS-REFERENCE TO RELATED APPLICATIONS

This application represents the national stage entry of PCT international Application No. PCT/EP2013/001000 filed Apr. 4, 2013 and claims the benefit of German Patent Application No. 10 2012 205 768.4 filed Apr. 10, 2012. The contents of both of these applications are hereby incorporated by reference as if set forth in their entirety herein.

The present invention relates to a transponder layer, in particular for producing a chip card, having an antenna substrate, which, on an antenna side, is equipped with an antenna formed from a wire conductor, and has a chip accommodation which is formed by a recess in the antenna substrate and in which a chip is accommodated, wherein wire conductor ends, which serve to form terminal ends of the antenna, are formed at a bottom of the chip accommodation which is recessed with respect to the rear side of the antenna substrate, and the chip is accommodated in the chip accommodation in such a manner that terminal contacts arranged on a contact side of the chip are contacted with flat contact portions of the terminal ends, and the chip is arranged with the rear side of its semiconductor body facing the terminal contacts substantially flush with the rear side of the antenna substrate.

Furthermore, the present invention relates to a card inlay having a transponder layer as well as a chip card produced with such a card inlay and a method for producing a transponder layer.

For producing transponder arrangements which serve for contactless communication with a reading device and have a chip contacted with an antenna on a carrier substrate, it is known to use multi-layer laminate structures, wherein one laminate layer is equipped with an antenna which is formed from a wire conductor, and whose terminal ends are contacted with the chip. For instance, such transponder arrangements are configured as a contactless chip card or are known as a transponder tag or a transponder token.

In particular when producing contactless chip cards, it is known, for facilitating contacting of the chip as well as for achieving a mechanical protection for the chip, to arrange the chip in a housing on a contact carrier, wherein the contact carrier forms a chip module together with the chip which is accommodated in the housing. On its contact surface which is formed by the contact carrier, the chip module has module contact surfaces which are enlarged relative to the terminal surfaces of the chip, and which facilitate contacting the chip with the terminal ends of the antenna.

In contrast to the dimensions of the semiconductor body of the chip, the chip module has substantially enlarged outer dimensions. In particular, the height of the chip module is substantially larger than the height of the actual chip, such that arranging a chip module in a laminate structure already requires a corresponding number of laminate layers. Regularly, with known cards having a laminate structure, it is thus the case that already one laminate layer is required for housing the contact carrier of the chip module equipped with the enlarged terminal surfaces and a second laminate layer is required to house the housing surrounding the semiconductor body of the chip in the laminate structure. If it is assumed that regularly, for covering the antenna of the antenna substrate as well as for covering the chip module, at least one further laminate layer is respectively required, with the known chip cards which are designed as a laminate structure, a minimum number of four laminate layers results, to which further external laminate layers might be added, which, as visible layers, are material to the external configuration of the chip cards.

The present invention is based on the object to make it possible to produce a chip card with the smallest possible number of laminate layers.

The transponder layer according to the invention has an antenna substrate, which, on an antenna side, is equipped with an antenna formed from a wire conductor, and has a chip accommodation which is formed by a recess in the antenna substrate and in which a chip is accommodated, wherein wire conductor ends, which serve to form terminal ends of the antenna, are formed at a bottom of the chip accommodation which is recessed with respect to the rear side of the antenna substrate, and the chip is accommodated in the chip accommodation in such a manner that terminal contacts arranged on a contact side of the chip are contacted with flat contact portions of the terminal ends, and the chip is arranged with the rear side of its semiconductor body facing the terminal contacts substantially flush with the rear side of the antenna substrate.

The transponder layer formed according to the invention makes it possible to house the chip without using a housing which accommodates the chip in only one laminate layer. This is in particular achieved in that the wire conductor ends, which form the terminal ends in the antenna for contacting with the chip, comprise flat contact portions which are directly contacted with the terminal contacts of the chip, without a contact carrier for forming enlarged terminal surfaces being provided between the chip and the terminal ends of the antenna.

In contrast to the contact contour which is convex in the cross-section of the wire conductor ends, the flat contact portions of the wire conductor ends form enlarged terminal surfaces which enable a secure contacting with the terminal surfaces of the chip. By arranging the chip and the semiconductor body of the chip, respectively, substantially flush with respect to the surface of the antenna substrate, the chip is securely accommodated in the recess of the antenna substrate, without areas of the chip which protrude from the recess of the antenna substrate establishing a requirement for an additional laminate layer. In this way, a transponder layer is created which is defined with respect to its outer dimensions solely by the antenna substrate and, in particular, does not establish a requirement for a further laminate layer in addition to the antenna substrate for housing the chip.

With a preferred embodiment of the transponder layer, the chip accommodation is formed as a window opening in the antenna substrate, and the flat contact portions of the wire conductor ends form the bottom of the chip accommodation. This embodiment has the particular advantage that the recess in the antenna substrate can already be formed before arranging the antenna formed from the wire conductor on the antenna substrate, such that the wire conductor ends are freely accessible for a subsequent contacting with the chip, without a special processing of the antenna substrate still being necessary therefor.

With an alternative embodiment of the transponder layer, the chip accommodation is formed as an indentation in the antenna substrate with a bottom formed by the antenna substrate, wherein the flat contact portions of the terminal ends are arranged in the bottom of the chip accommodation. This advantageous embodiment makes it possible to form the flat contact portions of the wire conductor ends and the recess in a common processing step.

With the card inlay according to the invention which comprises the transponder layer according to the invention, the transponder layer is arranged as an intermediate layer between a lower cover layer and an upper cover layer in a layer composite with the cover layers, in such a manner that the lower cover layer is arranged on the antenna side of the antenna substrate and the upper cover layer is arranged both on the rear side of the antenna substrate and on the rear side of the semiconductor body of the chip.

In this way, a card inlay, which can in particular be used as a semi-finished product in the production of chip cards, is proposed which already comprises the protected arrangement both of the antenna and of the chip in a laminate layer structure with only three laminate layers.

In a minimum configuration, the chip card according to the invention comprises the card inlay according to the invention, wherein a lower external layer of the chip card is formed by the lower cover layer of the card inlay and an upper external layer of the chip card is formed by the upper cover layer of the card inlay.

In this way, the chip card forms a so-called "white card", which makes it possible to produce a complete chip card with a laminate structure consisting of only three laminate layers, namely the transponder layer, the lower cover layer and the upper cover layer, by means of for instance, a direct marking or imprinting of the external layer.

Even if, according to one embodiment of the chip card, additionally to the lower and the upper cover layer, said chip card is equipped with a lower external layer and an upper external layer for achieving a particular configuration of the chip card, this individually configured chip card is still also characterized by a laminate structure with the smallest possible number of laminate layers.

When carrying out the method according to the invention, an antenna substrate, which, on an antenna side, is equipped with an antenna formed from a wire conductor, is subjected to energy from the rear side of the antenna substrate in the area of a chip accommodation, which is formed in the antenna substrate, and over whose bottom terminal ends of the antenna, which are formed from the wire conductor, extend, in such a manner that at the terminal ends of the antenna, flat contact portions which are directed toward the rear side of the antenna substrate are formed. Subsequently, contacting of the flat contact portions with terminal contacts of the chip which are arranged on the contact side of a chip is carried out in such a manner that the chip is accommodated in the antenna substrate with the rear side of its semiconductor body facing the terminal contacts substantially flush with the rear side of the antenna substrate.

With a first advantageous variant of the method, forming the flat contact portions is effected by means of a reforming process of the wire conductor which forms the terminal ends of the antenna, such that, for instance, forming the flat contact portions can be carried out by means of a stamping tool which causes a deformation of the wire conductor cross-section for forming the flat contact portions.

Alternatively, it is also possible to carry out forming the flat contact portions by means of a mechanical machining process which can be effected in a cutting manner, for instance carried out with a milling tool, or in an abrasive manner, for instance carried out with a grinding tool.

A contactless processing of the wire conductor ends for forming the flat contact portions is made possible when the flat contact portions are formed by means of a laser treatment of the wire conductor ends.

For contacting the terminal contacts of the chip with the flat contact portions of the wire conductor ends, in particular in such a case when the terminal contacts of the chip are equipped with metallic contact elevations, it has proven to be advantageous to subject the wire conductor which forms the terminal ends of the antenna to pressure and temperature for contacting.

In particular in such a case when the terminal contacts of the chip are equipped with contact elevations from a conductive adhesive for a subsequent contacting, it has proven to be advantageous to carry out contacting by subjecting the wire conductor which forms the terminal ends of the antenna to pressure.

Independently of the manner in which the terminal contacts of the chip are equipped with contact elevations, in any case they have the advantage that by means of the level of pressure applied during the contacting process, the intended substantially flush arrangement of the rear side of the semiconductor body of the chip with the rear side of the antenna substrate can be adjusted by means of the level of pressure acting on the contact elevations.

In the following, an advantageous embodiment of the transponder layer as well as the use thereof for producing a card inlay and a chip card, respectively, is explained in more detail by means of the drawings.

Figure 1:
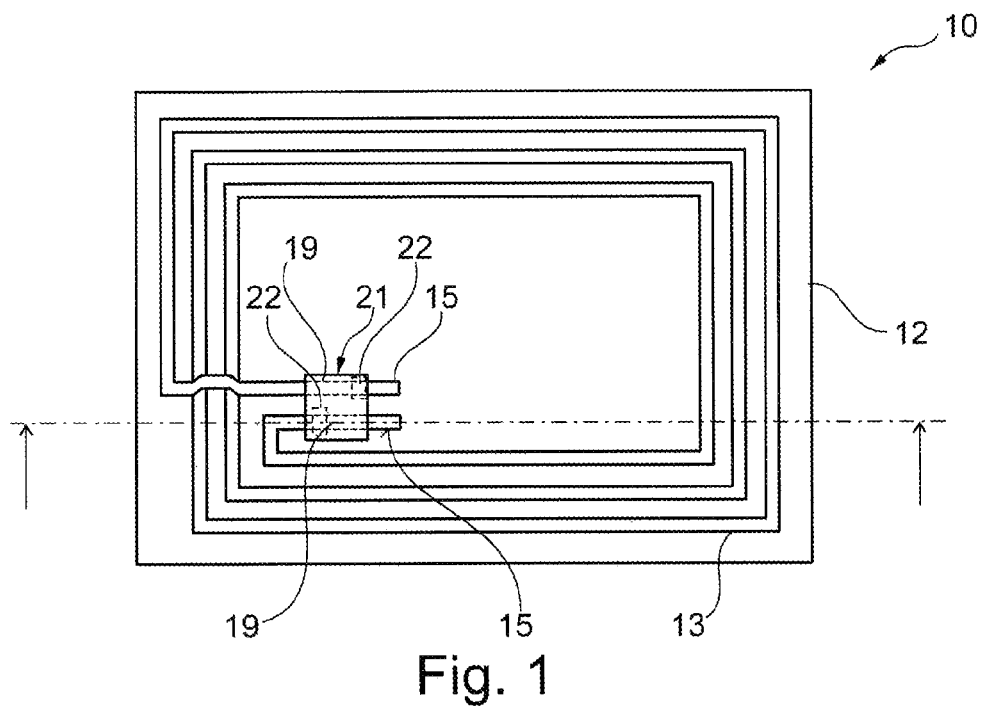
FIG. 1 shows a transponder layer in a top view.
Figure 2:
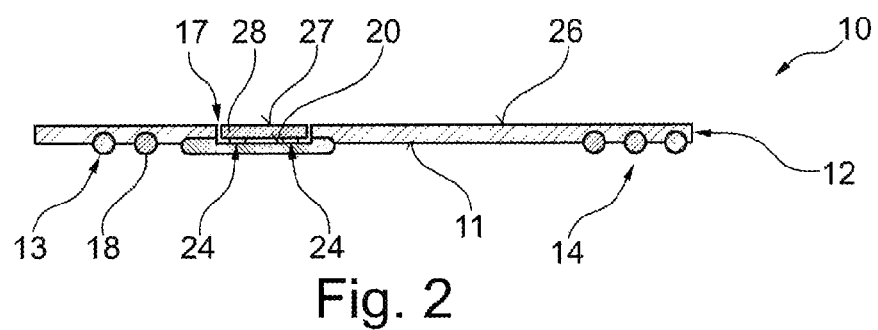
FIG. 2 shows a transponder layer in a longitudinal-sectional view.

In FIGS. 1 and 2, a transponder layer 10 is illustrated which, on an antenna side 11 of an antenna substrate 12, is equipped with an antenna 14 formed from a wire conductor 13. The antenna 14 comprises two terminal ends 15 formed from the wire conductor 13, which, on the antenna side 11, are guided across a window opening 17, which is formed in the antenna substrate 12.

As can in particular be taken from the illustration in FIG. 2, in the present case, the wire conductor 13 for forming the antenna 14 is embedded with a part of its wire conductor cross-section 18 in the antenna substrate 12, which is formed from PVC for instance. As can further be seen from FIGS. 1 and 2, in the area of its terminal ends 15 which are guided across the window opening 17, the wire conductor 13 comprises flat contact portions 19 which form a bottom 20 of the recess formed in the antenna substrate 12 by the window opening 17. In the window opening 17, a chip 21 is inserted which, on its terminal contacts 22, is equipped with contact elevations 24, here for instance in a metallic form, which are contacted with the flat contact portions 19, which are directed toward a rear side 26 of the antenna substrate 12. In this case, the chip 21 is accommodated in the window opening 17 in such a manner that a rear side 27 of a semiconductor body 28 of the chip 21 is oriented flush with the rear side 26 of the antenna substrate 12.

Figure 3:
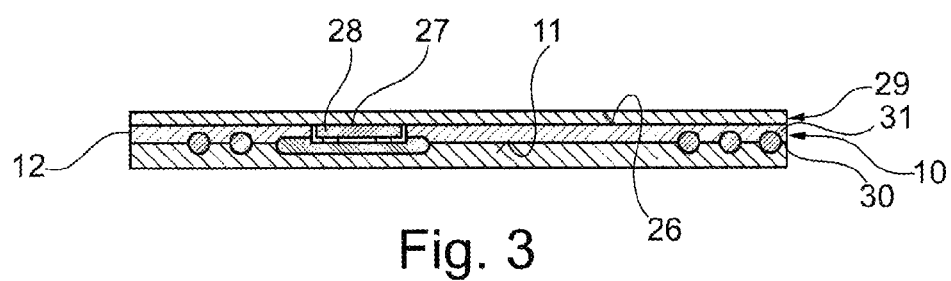
FIG. 3 shows a chip card inlay produced using the transponder layer in a longitudinal-sectional view.

FIG. 3 shows a card inlay 29 which is formed as a laminate structure and accommodates the transponder layer 10 illustrated in FIG. 2 as an intermediate layer between a lower cover layer 30, which is arranged on the antenna side 11 of the antenna substrate 12, and an upper cover layer 31, which is arranged on the rear side 26 of the antenna substrate 12, in a layer composite with the cover layers 30, 31.

In particular, the upper cover layer 31 is located both in a layer composite with the antenna substrate 12 and in a composite with the semiconductor body 28.

Figure 4A:
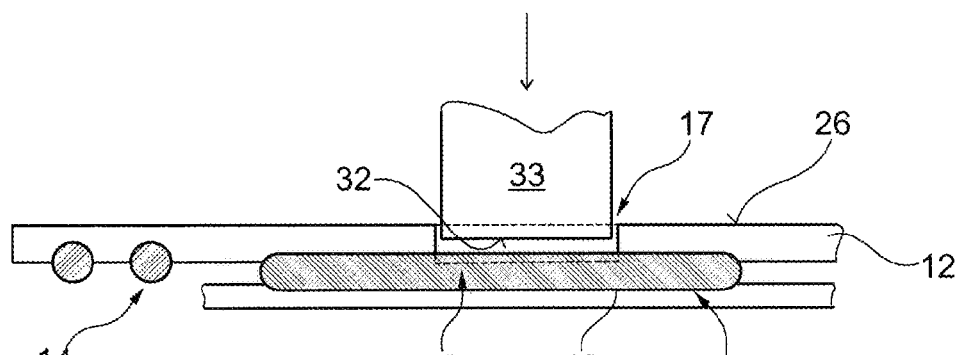
FIGS. 4a, 4b show the production of a transponder layer on the basis of a first embodiment of an antenna substrate.
Figure 4B:
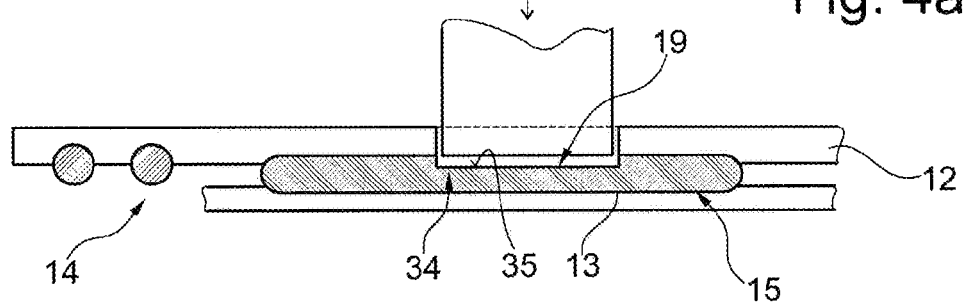

In FIGS. 4a and 4b, a possibility for producing the flat contact portions 19 in the terminal ends 15 of the antenna 14 formed by the wire conductor 13 is illustrated. It results from the order of FIGS. 4a and 4b that, starting from a state in which, as FIG. 4a shows, the wire conductor 13 extends across the window opening 17 in the antenna substrate 12 with its original wire conductor cross-section 18, a compression stamp 33, whose end cross-section 32 substantially corresponds to the cross-section of the window opening 17, is pressed against the wire conductor 13 from the rear side 26 of the antenna substrate 12, such that, by means of a reforming process in the area of the window opening 17, the flat contact portions 19 are formed, which have a contact cross-section 34 which deviates from the original wire conductor cross-section 18, and which forms a substantially planar contact surface 35 in the area of the flat contact portions 19.

Figure 5A:
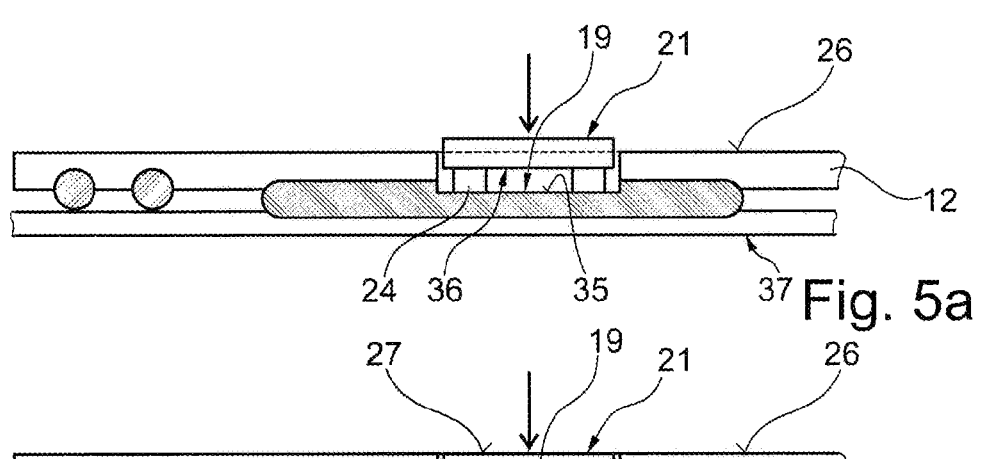
FIGS. 5a, 5b show the contacting of a chip with the antenna substrate illustrated in FIGS. 4a, 4b.
Figure 5B:
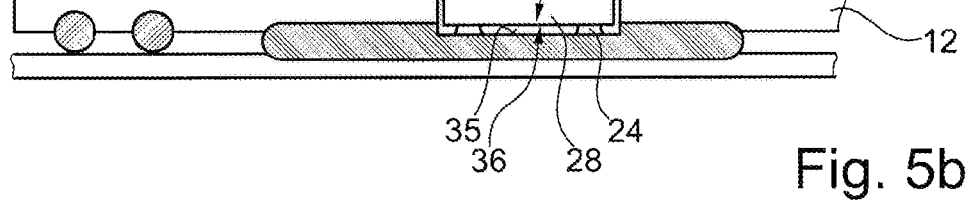

In FIGS. 5a and 5b, the contacting process is illustrated, in the course of which, from the rear side 26 of the antenna substrate 12, the chip 21 is inserted into the window opening 17 with its contact side 36 directed against the flat contact portions 19, wherein the contact elevations 24 abut against the contact surfaces 35 of the flat contact portions. With the thermocompression method illustrated by way of example in FIGS. 5a and 5b, now a melting of the contact elevations 24 is caused while simultaneously subjecting the chip 21 to pressure, wherein the pressure and the temperature are attuned to each other in such a way that the flush arrangement of the rear side 27 of the semiconductor body 28 of the chip 21 with the rear side 26 of the antenna substrate 12 illustrated in FIG. 5b is achieved. Preferably, the pressure required for the contacting is applied to the rear side 27 of the semiconductor body 28, whereas the heating, which is effected for melting the contact elevations 24, is effected by heating the wire conductor 13 via a mounting plate 37 used with the contacting process.

Figure 6A:
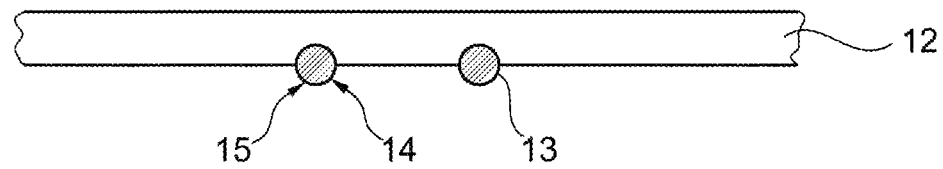
FIGS. 6a, 6b show the production of a transponder layer on the basis of a second embodiment of the transponder substrate.
Figure 6B:
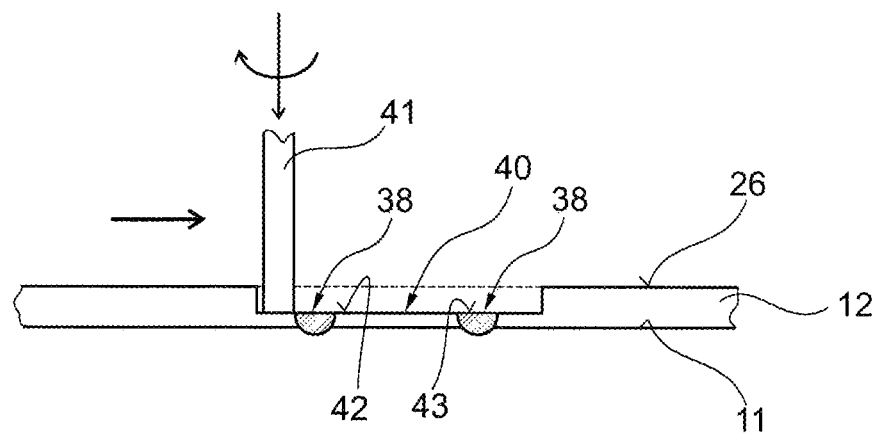
Figure 7:
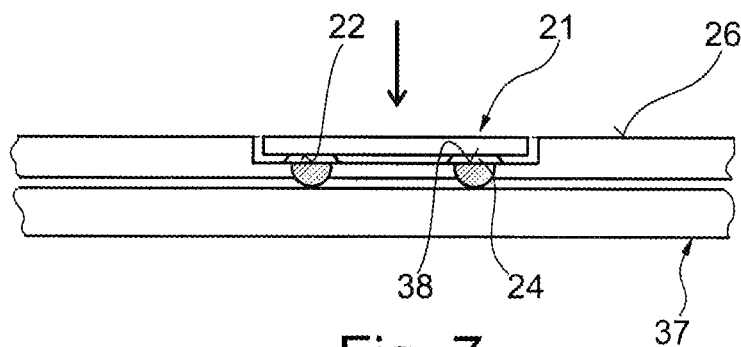
FIG. 7 shows the contacting of the chip with the transponder substrate illustrated in FIGS. 6a, 6b.

In FIGS. 6a and 6b, a further possibility for generating flat contact portions 38 in the area of the wire conductor 13, which forms the terminal ends 15 of the antenna 14, is illustrated, wherein producing the flat contact portions 38 is effected at the same time as forming an indentation 40 in the antenna substrate 12 which serves to accommodate the chip 21 (FIG. 7).

With the variant shown here, a rotating milling tool 41 is guided toward the wire conductor 13, which is arranged on the antenna side 11 of the antenna substrate 12, from the rear side 26 of the antenna substrate 12. In the process, a bottom 42 of the indentation 40, in which the flat contact portions 38 are arranged flush with their contact surfaces 43, is formed in the antenna substrate 12.

In analogy to the illustrations in FIGS. 5a and 5b, contacting the chip 21 with the antenna 14 arranged on the antenna substrate 12 can be effected by the fact that the chip is inserted into the indentation 40 from the rear side 26 of the antenna substrate 12 and, at the same time, is contacted with the flat contact portions 38 via the contact elevations 24 which are arranged on the terminal contacts 22 of the chip 21.

The invention claimed is:

1. A method for producing a transponder layer for use in a multi-layer laminated chip card, the transponder layer comprising an antenna substrate including a wire conductor having a substantially round cross-section embedded with a portion of its cross-section in an elongate layer of plastic and the remaining portion of the wire conductor cross-section protruding from the elongate layer of plastic, wherein the antenna substrate comprises a first side comprising a plastic surface, and a second side including a protruding metal conductor, said method comprising:
 removing plastic from the first side of the antenna substrate to form a chip accommodation window sized and dimensioned to receive a package-less chip, the chip accommodation window exposing portions of the metal conductor to the first side of the antenna substrate, wherein flat contact portions are formed in the exposed portions of the wire conductor in the chip accommodation area;
 positioning the chip accommodation window adjacent a mounting plate;
 inserting a package-less chip in the chip accommodation window with a surface of the package-less chip including terminal contacts contacting the exposed portions of the metal conductor in the chip accommodation window;
 heating the wire conductor; and
 applying pressure to the package-less chip from the first side of the plastic substrate, wherein the terminal contacts of the chip directly contact the flat contact portions of the wire conductor, and the chip is accommodated in the antenna substrate with the side of semiconductor body opposite the surface including terminal contacts flush with the first side of the antenna substrate.

2. The method according to claim 1, wherein the terminal contacts include contact elevations of a conductive adhesive, and further comprising the step of applying pressure to the terminal ends to contact the terminal contacts of the chip with the flat contact portions.

3. The method of claim 1, further comprising the step of forming the flat contact portions of the terminal ends at the bottom of the window.

4. The method of claim 1, further comprising the step of forming a three layer laminate chip card by arranging the transponder layer as an intermediate layer between a lower cover layer and an upper cover layer in a layer composite, wherein the lower cover layer is arranged on the antenna side of the antenna substrate and the upper cover layer is arranged both on the rear side of the antenna substrate and on the rear side of the semiconductor body of the chip.

5. The method of claim 4, wherein the lower external layer of the chip card is formed by the lower cover layer of the card inlay and an upper external layer of the chip card is formed by the upper cover layer of the card inlay.

* * * * *